United States Patent
Yang et al.

(10) Patent No.: US 8,691,664 B2
(45) Date of Patent: Apr. 8, 2014

(54) BACKSIDE PROCESS FOR A SUBSTRATE

(75) Inventors: Ku-Feng Yang, Dali (TW); Weng-Jin Wu, Hsin-Chu (TW); Wen-Chih Chiou, Miaoli (TW); Jung-Chih Hu, Yangmei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/685,523

(22) Filed: Jan. 11, 2010

(65) Prior Publication Data

US 2010/0267217 A1    Oct. 21, 2010

Related U.S. Application Data

(60) Provisional application No. 61/170,961, filed on Apr. 20, 2009.

(51) Int. Cl.
*H01L 21/00* (2006.01)

(52) U.S. Cl.
USPC ............... 438/459; 438/629; 438/637

(58) Field of Classification Search
USPC ......... 438/459, 629, 637, 672, 675, 959, 626, 438/631, 645
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,627,106 A | 5/1997 | Hsu |
| 5,640,049 A | 6/1997 | Rostoker et al. |
| 5,756,395 A | 5/1998 | Rostoker et al. |
| 5,767,001 A | 6/1998 | Bertagnolli et al. |
| 5,998,292 A | 12/1999 | Black et al. |
| 6,184,060 B1 | 2/2001 | Siniaguine |
| 6,187,677 B1 | 2/2001 | Ahn |
| 6,239,495 B1 | 5/2001 | Sakui et al. |
| 6,322,903 B1 | 11/2001 | Siniaguine et al. |
| 6,355,950 B1 | 3/2002 | Livengood et al. |
| 6,426,288 B1 * | 7/2002 | Meikle .................. 438/650 |
| 6,448,168 B1 | 9/2002 | Rao et al. |
| 6,465,892 B1 | 10/2002 | Suga |
| 6,472,293 B1 | 10/2002 | Suga |
| 6,495,454 B2 | 12/2002 | Livengood et al. |
| 6,538,333 B2 | 3/2003 | Kong |
| 6,583,045 B1 | 6/2003 | Liu et al. |

(Continued)

FOREIGN PATENT DOCUMENTS

| | | |
|---|---|---|
| CN | 1858908 | 11/2006 |
| CN | 1858909 A | 11/2006 |
| JP | 2007-250561 | 9/2007 |
| TW | 424002 A * | 3/2001 |

*Primary Examiner* — Richard Booth
(74) *Attorney, Agent, or Firm* — Slater & Matsil, L.L.P.

(57) ABSTRACT

A method of forming a semiconductor device is presented. A conductor is embedded within a substrate, wherein the substrate contains a non-conducting material. The backside of the substrate is ground to a thickness wherein at least 1 μm of the non-conducting material remains on the backside covering the conductor embedded within the substrate. Chemical mechanical polishing (CMP) is employed with an undiscerning slurry to the backside of the substrate, thereby planarizing the substrate and exposing the conductive material. A spin wet-etch, with a protective formulation, is employed to remove a thickness y of the non-conducting material from the backside of the substrate, thereby causing the conductive material to uniformly protrude from the backside of the substrate.

20 Claims, 6 Drawing Sheets

(56) References Cited

U.S. PATENT DOCUMENTS

| | | | |
|---|---|---|---|
| 6,599,778 B2 | 7/2003 | Pogge et al. | |
| 6,639,303 B2 | 10/2003 | Siniaguine | |
| 6,642,081 B1 | 11/2003 | Patti | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,818,931 B2 | 11/2004 | Liu et al. | |
| 6,841,469 B2 * | 1/2005 | Sawada et al. | 438/629 |
| 6,841,883 B1 | 1/2005 | Farnworth et al. | |
| 6,882,030 B2 | 4/2005 | Siniaguine | |
| 6,897,125 B2 | 5/2005 | Morrow et al. | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,276,787 B2 * | 10/2007 | Edelstein et al. | 257/698 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,365,418 B2 | 4/2008 | Hsu | |
| 7,402,515 B2 | 7/2008 | Arana et al. | |
| 7,615,841 B2 | 11/2009 | Chen et al. | |
| 7,742,277 B2 | 6/2010 | Shinoda et al. | |
| 7,786,584 B2 | 8/2010 | Barth et al. | |
| 7,872,357 B2 | 1/2011 | Yu et al. | |
| 7,902,643 B2 | 3/2011 | Tuttle | |
| 2002/0048901 A1 * | 4/2002 | Brouillette et al. | 438/459 |
| 2002/0123299 A1 * | 9/2002 | Chopra et al. | 451/36 |
| 2002/0164839 A1 | 11/2002 | Enquist | |
| 2003/0064671 A1 * | 4/2003 | Pasqualoni et al. | 451/308 |
| 2003/0073601 A1 * | 4/2003 | Small et al. | 510/391 |
| 2003/0232488 A1 | 12/2003 | Chua et al. | |
| 2005/0042867 A1 | 2/2005 | Sanchez et al. | |
| 2005/0121768 A1 | 6/2005 | Edelstein et al. | |
| 2005/0139954 A1 | 6/2005 | Pyo | |
| 2005/0164490 A1 | 7/2005 | Morrow et al. | |
| 2006/0027934 A1 | 2/2006 | Edelstein et al. | |
| 2006/0057836 A1 | 3/2006 | Nagarajan et al. | |
| 2006/0151870 A1 | 7/2006 | Nishiyama et al. | |
| 2006/0281309 A1 | 12/2006 | Trezza | |
| 2007/0126041 A1 | 6/2007 | Shinoda et al. | |
| 2007/0190692 A1 | 8/2007 | Erturk et al. | |
| 2007/0216041 A1 | 9/2007 | Patti et al. | |
| 2007/0278619 A1 | 12/2007 | Clevenger et al. | |
| 2008/0020488 A1 | 1/2008 | Clevenger et al. | |
| 2008/0073747 A1 | 3/2008 | Chao et al. | |
| 2008/0124845 A1 | 5/2008 | Yu et al. | |
| 2008/0142900 A1 | 6/2008 | Kim et al. | |
| 2008/0206984 A1 | 8/2008 | Sparks et al. | |
| 2008/0220565 A1 | 9/2008 | Hsu et al. | |
| 2008/0283871 A1 | 11/2008 | Hamada | |
| 2009/0001598 A1 * | 1/2009 | Chiou et al. | 257/777 |
| 2009/0008794 A1 * | 1/2009 | Wu et al. | 257/777 |
| 2009/0155624 A1 | 6/2009 | Dudesek et al. | |
| 2009/0224371 A1 | 9/2009 | Yu et al. | |
| 2009/0283871 A1 | 11/2009 | Chang et al. | |
| 2011/0177655 A1 | 7/2011 | Chiou et al. | |

* cited by examiner

COMPOSITION OF Si/Cu SLURRY

| ABRASIVE | COLLOIDAL SILICA |
|---|---|
| BASE | KOH, $NH_4(OH)$ |
| OXIDIZER | $H_2O_2$, $KIO_3$, AMMONIUM PERSULFATE (APS), $KNO_3$ |
| ADDITIVE | Cu INHIBITOR, BTA, EDTA |

BACKSIDE PROCESS FOR A SUBSTRATE

This application claims the benefit of U.S. Provisional Application No. 61/170,961 filed on Apr. 20, 2009, entitled "Backside Process for a Substrate," which application is hereby incorporated herein by reference.

CROSS-REFERENCE TO RELATED APPLICATIONS

This application relates to the following co-pending and commonly assigned U.S. patent applications: application Ser. No. 12/178,021, filed Jul. 23, 2008, entitled "System, Structure, and Method of Manufacturing a Semiconductor Substrate Stack;" and application Ser. No. 11/769,559, filed Jun. 27, 2007, entitled "Formation of Through Via before Contact Processing," which applications are hereby incorporated herein by reference.

TECHNICAL FIELD

The present invention relates generally to integrated circuit fabrication and more particularly to a backside process for a substrate.

BACKGROUND

Generally, the speed at which an integrated circuit operates is influenced by the distance between the farthest separated components that communicate with each other on the chip. Laying out circuits as three-dimensional structures has been shown to significantly reduce the communication path length between on-chip components, provided the vertical distances between the layers are much smaller than the chip width of the individual layers. Thus, by bonding and stacking circuit layers vertically, the overall chip speed is typically increased.

Wafer bonding is the joining of two or more semiconductor wafers on which integrated circuitry has been formed. Wafers may be joined by direct bonding of external oxide layers or by adding adhesives to inter-metal dielectric (IMD) layers. The bonded result produces a three-dimensional wafer stack, which may subsequently be diced into separate "stacked die," with each individual stacked die having multiple layers of integrated circuitry. In addition to the increased speed that the three-dimensional circuitry typically experiences, wafer stacking offers other potential benefits, including improved form factors, lower costs, and greater integration through system-on-chip (SoC) solutions. In order to enable the various components integrated within each stacked die, electrical connections are provided that form conductors between vertical layers. Through silicon vias (TSVs) are typically fabricated to provide vias filled with a conducting material that pass completely through the substrate to contact and connect with the other TSVs and conductors of the bonded layers.

In various methods, TSVs are formed after the contact process, inter-level dielectrics (ILDs), or after the top metallization process, for example. The substrate may then be inverted and be ground down in a back-grind process to expose the TSVs. This method of exposing the TSVs may damage the structures, which may both lower yield and reduce product reliability. Further, TSVs may not be of uniform thickness. If the backside process does not compensate for non-uniformity, a percentage of TSVs may not be conducting in the substrate stack, causing failure of the device.

SUMMARY OF THE INVENTION

Therefore, what is needed is a backside process that eliminates or minimizes the backside damage to conductive material embedded in the substrate and compensates for any non-uniformity of the range of embedded conductor thicknesses. The example process used herein is through substrate vias (TSVs), however other embedded conductors are within the scope of the various embodiments. The thickness of the TSV herein refers to the depth or height of the TSV depending on orientation of the substrate.

In accordance with a preferred embodiment of the present invention, a method of forming a semiconductor device is presented. A conductor is embedded within a substrate, wherein the substrate is comprised of a non-conducting material. The backside of the substrate is ground to a thickness wherein at least 1 μm of the non-conducting material remains on the backside covering the conductor embedded within the substrate. Chemical mechanical polishing (CMP) is employed with an undiscerning slurry to the backside of the substrate, thereby planarizing the substrate and exposing the conductive material. A spin wet-etch, with a protective formulation, is employed to remove a thickness y of the non-conducting material from the backside of the substrate, thereby causing the conductive material to uniformly protrude from the backside of the substrate.

An advantage of a preferred embodiment of the present invention is that the conductive material, such as used in TSV structures, is not damaged by the mechanical grinding step.

A further advantage of an illustrative embodiment is that there is compensation for the non-uniformity of the conductive material, such as TSV thickness, thereby forming a planarized substrate that uniformly exposes the conductive material.

Another advantage of an illustrative embodiment is the precise process control, high throughput, and high within-wafer uniformity.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The present invention will be described with respect to illustrative embodiments in a specific context, namely a frontto-front stacked semiconductor substrate system employing through substrate vias (TSVs). The invention may also be applied, however, to other semiconductor substrates with embedded conductors. Further examples are semiconductor systems, such as single substrates, back-to-back bonded substrates, chip stacks, multiple substrate stacks, and the like. Embodiments may also have applications in other TSV processes or conductors embedded in substrate processes.

Figure 1:
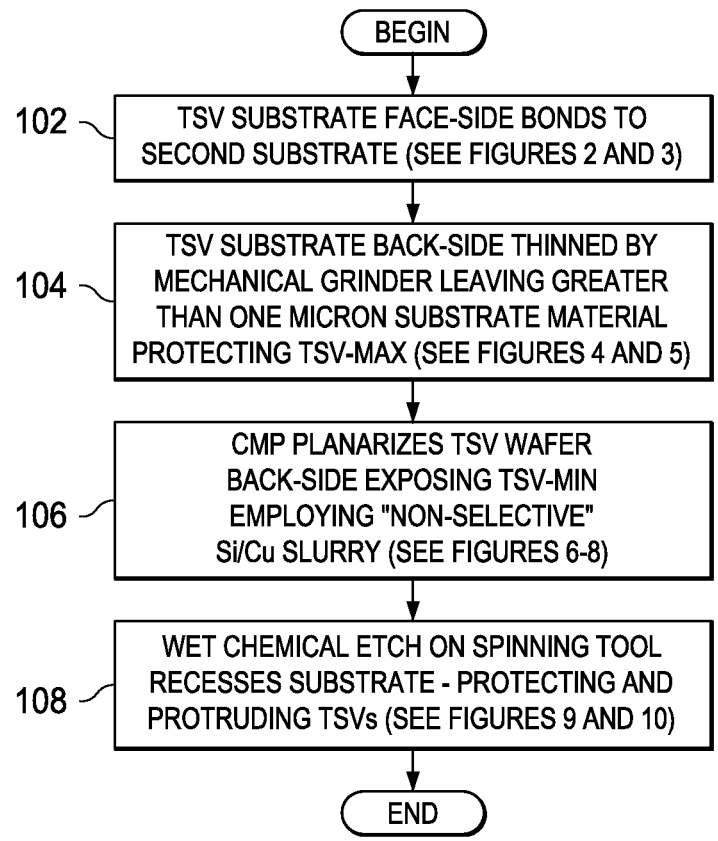
FIG. 1 is a process flow chart for a method of processing a TSV substrate backside.

FIG. 1 is a flow chart of a method for forming a TSV substrate within a semiconductor substrate stacking system. FIG. 1 provides an overview of an illustrative embodiment of the present invention. Each step of the illustrated process flow has a cross-sectional figure to aid in describing the process step. Each of these cross-sectional figures will be discussed in detail following the example process overview.

The process begins with a TSV substrate that has undergone standard processing. The standard processing has been completed to the point of bonding the front face of the TSV substrate to a second substrate. The standard processing may include etching, lining the TSV openings, and filling the TSV openings with conductive material, such as doped polysilicon, metals, metal alloys, combinations, or the like. The TSVs may be etched in for example, an otherwise completed device substrate, a device substrate that has undergone partial processing, or a non-device substrate, such as an interposer. Standard processing may include TSV openings that have been etched, for example, following a dielectric disposition, a metal interconnect layer or the like. However, the scope of the various embodiments includes all types of TSVs created on a semiconductor wafer.

The face side of the TSV substrate is bonded to a second substrate (step 102). The second substrate may be another TSV substrate, a device substrate that does not include TSVs, a glass substrate, a substrate carrier, an interposer, or the like. Furthermore, in the following subsequent processing, according to an illustrative embodiment, the backside of the TSV substrate may be bonded or attached to additional substrates. In other words, the TSV substrate may be a one substrate system, one substrate in a two substrate system, or one substrate in a multiple stacked substrate system, with subsequent substrates stacked both on and under the TSV substrate.

In any case, the backside of the TSV substrate is thinned by a mechanical grinder (step 104). The mechanical grinder leaves a layer, greater than 1 μm, of substrate material protecting the thickest TSV ($TSV_{max}$).

While standard TSV processing anticipates the TSVs to be of uniform thickness, that may not be the case in actual device processing. A number of variables may cause the TSVs to range in thickness between the thickest $TSV_{max}$ and the thinnest $TSV_{min}$. The variation in TSV thickness is expected and compensated for, which is an advantage of the illustrative embodiments. In a preferred embodiment, the mechanical grinder may leave between about 2 μm and about 5 μm of backside substrate material as measured from the "top" of $TSV_{max}$ to the ground surface of the substrate. The TSV substrate undergoes inversion during the bonding process; therefore, the term "top" is identified in subsequent figures as the point at which the TSV is closest to the backside of the substrate.

According to the illustrative embodiments, the mechanical grinding process (step 104) does not remove enough bulk material to expose $TSV_{max}$. The mechanical grinder may damage the TSV structure. The grinding motion may cause a TSV to crack or loosen from the TSV substrate or the TSV liner. Moreover, the grinding motion may damage the TSV conductive layer that is exposed. It is an advantage of the various embodiments that the mechanical grinding does not reach the TSVs thus, no TSV grinder damage occurs.

Following the mechanical grinding process (step 104), the TSV substrate is planarized using a chemical mechanical polishing process (step 106). The chemical mechanical polish (CMP) employs an undiscerning slurry. An undiscerning slurry is a slurry that polishes both non-conducting material at the same or at a similar rate as the conducting material. The CMP process and undiscerning slurry are designed to planarize the backside of the TSV substrate to at least the level of exposing $TSV_{min}$. Meaning that not only must the backside substrate material be planarized, but also TSVs that are thicker than $TSV_{min}$, for example $TSV_{max}$, must be planarized. Examples of an undiscerning slurry will be described in further detail in FIG. 6.

Next, a wet chemical etch on a spinning tool recesses the TSV substrate, while protecting the TSVs, thus allowing the TSVs to protrude (step 108) from the backside of the TSV substrate. Thus, the process flow ends and the TSV substrate is completed using standard processing.

Figure 2:
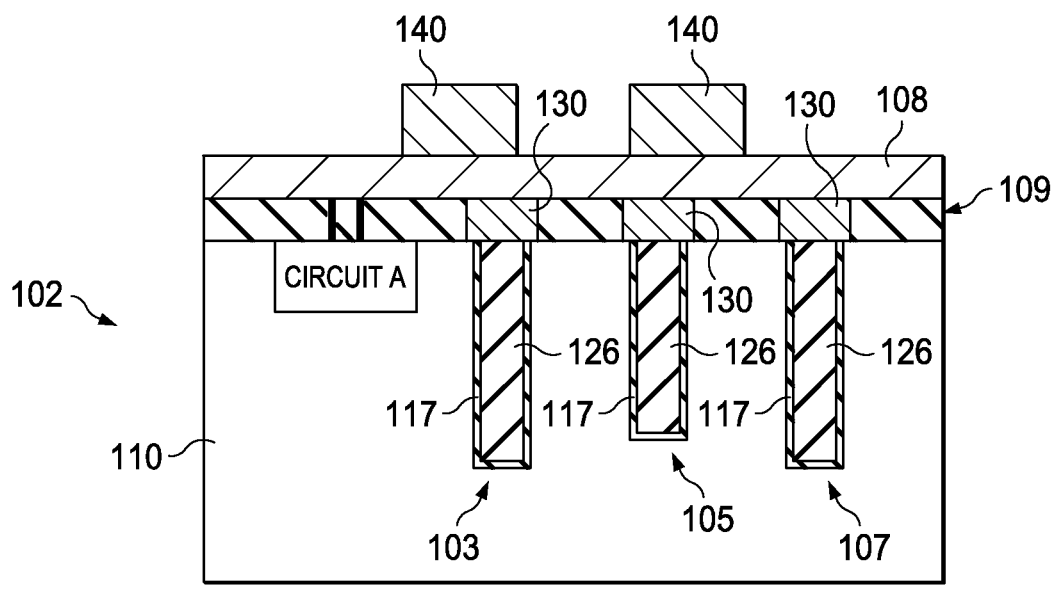
FIGS. 2-5 are cross-sectional views of a TSV substrate during select process steps in accordance with an illustrative embodiment.

Turning now to FIG. 2, a cross-sectional view of a typical TSV substrate is shown. Substrate 102 comprises bulk material 110, which is typically silicon (Si), but may also be made of gallium arsenide (GaAs), gallium arsenide-phosphide (GaAsP), indium phosphide (InP), gallium aluminum arsenic (GaAlAs), indium gallium phosphide (InGaP), and the like, and illustrates circuit A processed from bulk material 110. TSV cavities are etched into bulk material 110 using etching processes such as a Bosch etch. Note that TSVs 103, 105 and 107 are not necessarily of uniform thickness indicating that the cavity etch may not be uniform. Several variables may account for this non-uniformity, such as the material to be etched, photo pattern density, and the like.

Furthermore, in order to prevent conducting material from leaching into the active portions of the circuitry of substrate 102, liner oxide 117 may deposited within the recesses created for TSVs 103, 105 and 107. An insulating material, such as silicon nitride, may be used, other dielectrics may be used, or no liner may be used, within the scope of the various embodiments.

Conductor 126 is deposited into the cavities etched for TSVs 103, 105, and 107. Conducting material may comprise various materials, such as copper, tungsten, aluminum, gold, silver, other metals, metal alloys and the like. Conductor 126 fills the cavities forming TSVs 103, 105, and 107 and the excess portions of conductor 126 are removed, through etching, chemical mechanical polishing (CMP), or the like, before further processing. Additional insulating layer 109 is deposited on top of the planarized TSVs, resulting in TSV 103, 105 and 107 being enclosed within substrate 102.

Another set of etching and depositing processes creates contact pads 130 and interconnect layer 108 that provides contacts to circuit A and TSVs 103, 105, and 107, respectively.

Interconnect layer 108 may be comprised of metal and inter-metal dielectrics formed by disposing alternate layers of metal and inter-metal dielectrics. Conductive lines may comprise Cu, Al, W, other conductive material, or combinations thereof, for example. One or more barrier layers and seed layers may be deposited prior to the deposition of the Cu, Al, W, other conductors, or combinations thereof, for example (not shown). The conductive lines may be disposed employing a damascene process, a dual damascene process, an etched conductive layer process, or the like. Different layers of the multilayered interconnect layer 108 may be comprised of different materials.

The insulating layer or inter-metal dielectrics in the interconnect layers described herein may comprise traditional insulating materials used for interconnect layers, such as $SiO_2$, or alternatively may comprise low-K materials. The low-K material may comprise diamond-like carbon, such as Black Diamond™ by Applied Materials, Inc., phosphosilicate glass (PSG), borophosphosilicate glass (BPSG), fluorinated silicate glass or fluorinated silicon oxide glass (FSG), $SiO_xC_y$, Spin-On-Glass, Spin-On-Polymers, SILK™ by Dow Chemical, FLARE™ by Honeywell, LKD (low k dielectric) from JSR Micro, Inc., hydrogenated oxidized silicon carbon material (SiCOH), amorphous hydrogenated silicon (a-Si:H), $SiO_xN_y$, SiC, SiCO, SiCH, compounds thereof, composites thereof, and/or combinations thereof, for example. Insulating layer 109 may alternatively comprise a combination of one or more low-κ materials, high-κ materials, $SiO_2$, SiN, or combinations thereof, for example.

Bonding contacts 140, as shown in FIG. 2, may be formed by depositing an inter-metal dielectric (IMD) layer (not shown). Recesses are etched into the IMD layer into which conducting material is deposited to form bonding contacts 140. The insulation or dielectric material making up the IMD layer is completely removed, as shown, to reveal bonding contacts 140 elevated above the top of inverted TSV substrate 102. Those of ordinary skill in the art may appreciate that there are other standard processes for forming bonding contacts and interconnect layers, all of which are within the scope of the presently contemplated invention.

It should be noted that a conducting path exists between bonding contacts 140 and TSVs 103, 105, and 107, respectively. This path may comprise an indirect connection or may comprise a direct connection. The various embodiments of the present invention are not limited to a particular type of connection between bonding contacts 140 and TSVs 103, 105 and 107. In any case, whether example processes comprising interconnect layers 108, 109 and bond pads 140 are employed or other interconnect processes well known in the art are employed, a combined interconnect structure of a thickness "T" is formed (shown in FIG. 4). In the illustrated embodiments, interconnect layer 108 is schematically illustrated as a continuous conductive element interconnecting each of TSVs 103, 105, and 107. Those skilled in the art will recognize, in practice, interconnect layer 108 will comprise multiple conductive elements that may or may not be electrically connected to one another, but which form respective conductive paths from each of TSVs 103, 105, and 107, by way of respective corresponding contact pads 130, to respective corresponding bonding contacts 140.

Continuing to look at FIG. 2, semiconductor circuits, such as circuit A, are manufactured by forming active regions in or on a semiconductor substrate, such as substrate 102, by depositing various insulating, conductive, and semiconductive layers over bulk material 110, and patterning them in sequential steps. The interconnect layer typically provides connections to underlying active regions and connections within and over the substrate. A contact layer is comprised of conductors 130 disposed in dielectric 109, which connect components in or on substrate 102 to interconnect layer 108. Conductors 130 may be any conducting material, such as doped polysilicon, Al, Cu, W, alloys, combinations, and the like. Preferably, the contact material is W. Dielectric 109 may comprise oxides, nitrides, phosphosilicate glass (PSG), borophosphosilicate glass (BPSG), fluorinated silicate glass, or fluorinated silicon oxide glass (FSG), or any electrically isolating material or materials.

Figure 3:
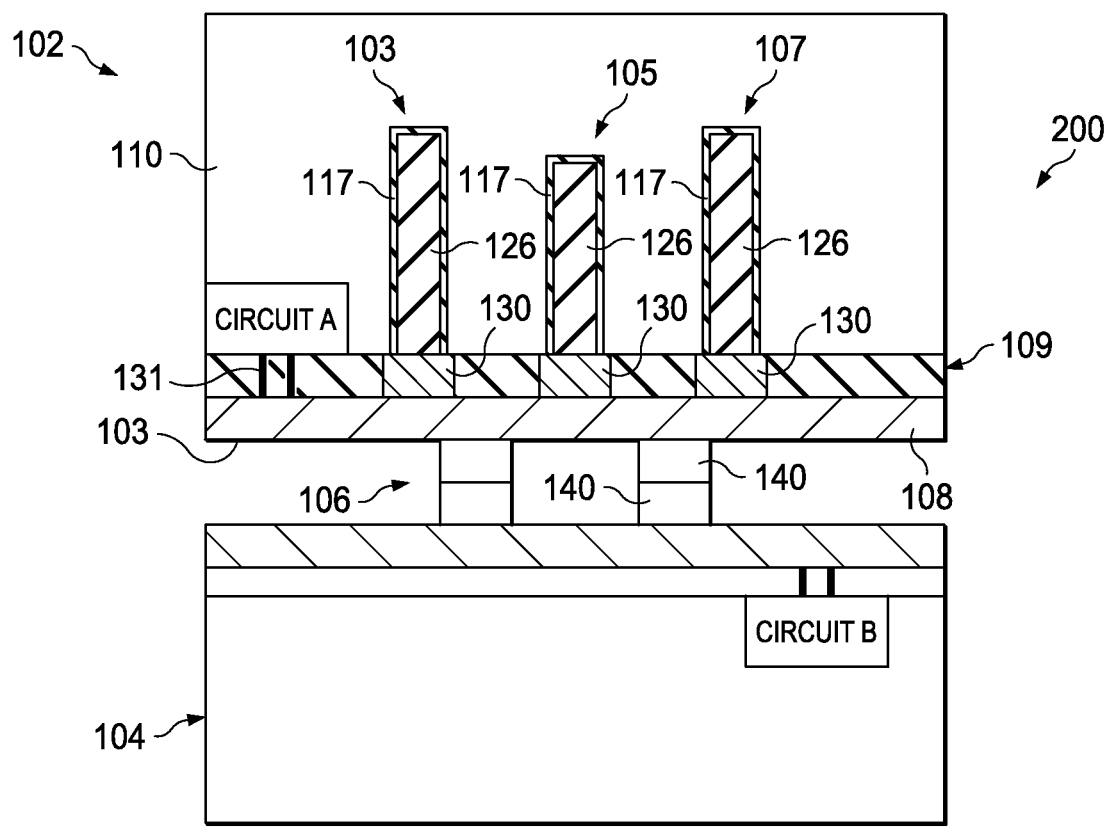

Turning to FIG. 3, a cross-sectional view of substrate 102 (first substrate) stacked and bonded to second substrate 104, forming stacked substrate system 200, is illustrated. In the illustrative embodiment shown, second substrate 104 comprises a device substrate including circuit B however, as previously discussed herein, the various embodiments are not so limited. Substrate 102 and second substrate 104 are bonded together by bonding contacts 140 at joint 106 to form stacked substrate system 200.

Bonding contacts 140 form respective electrical connections with contact pads 130 in insulation layer 109, through interconnect layer 108. Further, electrical connection 131 is provided to circuit A, and contact pads 130 are provided to TSVs 103, 105, and 107. Substrate 102 and second substrate 104 are joined into stacked substrate system 200 by directly bonding contacts 140. When bonding pads 140 are metal, the bonding may be beneficially implemented using a compatible metal, thus, creating a strong physical bond as well as a secure and definite electrical connection. Thus, substrate 102 and second substrate 104 are connected with a strong physical and electrical bond. Other methods of bonding may be implemented, for example, using adhesives applied to insulating layers or other methods well known in the art. In any case, electrical contact is made to the structures as described above.

It should be noted that any of several different conductive materials might be used to create the bonding contacts in the various additional and/or alternative embodiments of the present invention to create the bond between those bonding contacts. For example, the bonding material may be copper, tungsten, copper-tin alloy, gold-tin alloy, indium-gold alloy, lead-tin alloy, or the like. The present invention is not intended to be limited to any one or a simple set of such conductive materials.

It should also be noted that any number of different devices, components, connectors, and the like, may be integrated into substrate 102 and second substrate 104. Only a limited number of active devices, such as circuits A and B, and TSVs, such as TSVs 103, 105, and 107, are shown for the ease of illustration and clarity. However, those of ordinary skill in the art will appreciate that, in practice, the integrated circuitry associated with integrated circuits and stacked die may include millions or even tens of millions or more active devices and, further, that interconnect structures may include tens or even hundreds of conductors in the uppermost contact layers. Similarly, those of ordinary skill in the art will appreciate that each stacked substrate may, in practice, include dozens of backside connections using conductive vias and leads. The specific devices or lack of devices that may be illustrated herein are not intended to limit the embodiments of the present invention in any way. Further, as discussed above, any substrate with an embedded conductor is within the scope of the various embodiments.

Figure 4:
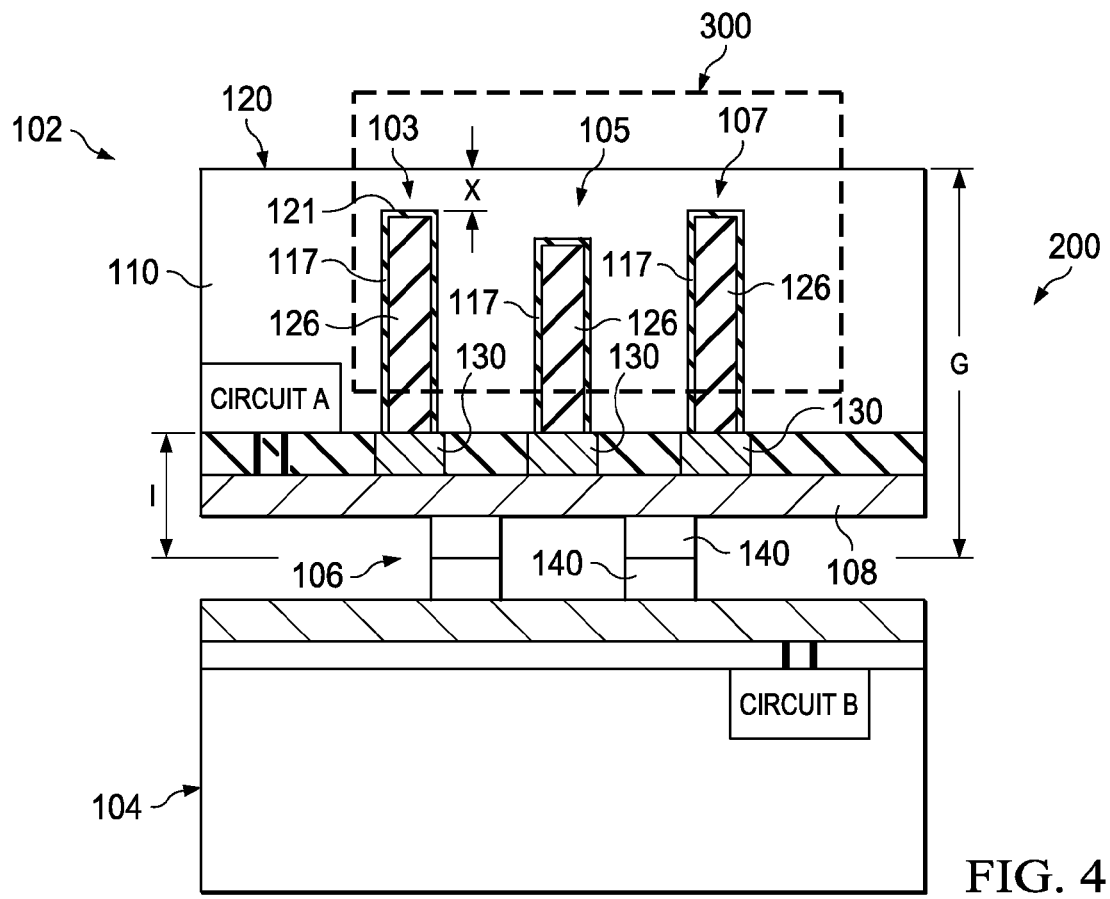

FIG. 4 is a cross-sectional view of stacked substrate system 200 configured according to one embodiment of the present invention. In order to provide backside contact points for TSVs 103, 105, and 107, portions of substrate 102 and bulk material 110 are removed through a mechanical grinding process. The mechanical grinding process may employ equipment and processes similar to a traditional wafer backgrind process. Current practice is to use vacuum or an adhesive tape to secure the substrate to the grinding chuck, and reduce the thickness of the substrate by grinding. Water may be used to cool the wafer and the thickness reduction may be accomplished in two or three passes. Often the grinding chuck will be designed to traverse between two wheels, one with coarse grit, and one with fine grit.

The backgrinding equipment, in accordance with an illustrative embodiment, may have an in-situ gauge to determine substrate thickness. The in-situ gauge may be an infra-red (IR) laser that compares the measured distance from the face of the second substrate and the backside of the first substrate to determine substrate thickness. For example, with an IR (wavelength 1300/800 nm for example) source laser gauge applied, light will penetrate into the backside of the first substrate Si layer and generate two reflections, one from the backside surface of the substrate and one from the Si layer to the device layer of the substrate. The thickness of the substrate may be obtained by calculating the time span between the two reflections. An ISIS gauge, or Hamamatsu gauge, are examples of gauges that may be used. Those of ordinary skill in the art will appreciate that other methods of determining thickness may be devised and they are within the scope of these embodiments. Further, the order of the process may be altered within the scope of the embodiments. Bonding a first and second substrate may occur following the backgrind process.

In the example shown in FIG. 4, TSV 103 is $TSV_{max}$, the thickest TSV, and TSV 105 is $TSV_{min}$, the thinnest TSV. Ground surface 120 does not expose any TSV structures. The backside of bulk material 110 of substrate 102 is removed until bulk material 110 is thinned to a layer greater than 1 μm thick, or preferably about 2 μm to about 5 μm thick, as measured from top 121 of $TSV_{max}$, to ground surface 120. The thickness X, as indicated, is the thickness between ground surface 120 and top 121 of $TSV_{max}$ 103. Therefore, the thickness G of substrate 102 after the mechanical grinding process is substantially the thickness of the interconnect layers (I), the thickness of $TSV_{max}$ ($T_{max}$), and the thickness of bulk layer 110 over $TSV_{max}$, which is X. Thus, the thickness of substrate 102 is substantially:

$$G = I + T_{max} + X,$$

where

G is the thickness of substrate 102 following mechanical grinding,

I is the thickness of the interconnect layers, $T_{max}$ is the thickness of the thickest TSV and X is the thickness of the bulk material between the top of $TSV_{max}$ and the ground surface.

Figure 5:
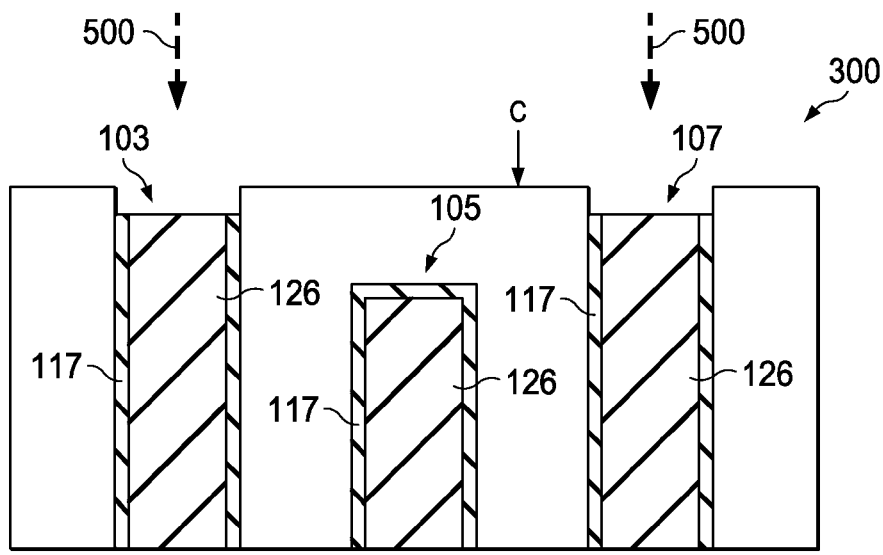

Turning to FIG. 5, a cross-sectional view of area 300, as shown in FIG. 4, illustrates area 300 of substrate 102 in stacked substrate system 200, during CMP processing. CMP is a process that uses an abrasive, corrosive slurry to physically grind flat and chemically remove the microscopic topographic features on a wafer so that subsequent processes can begin from a flat surface. Electrochemical Mechanical Planarization (ECMP) technology uses a unique electrochemical method to planarize copper at a high rate with ultra-low down force to produce a very smooth topography without damaging dielectric films. Both processes are termed CMP here within.

$TSV_{max}$ 103, $TSV_{min}$ 105, and TSV 107 are shown in bulk material 110. Liner oxide 117 and conductor 126 are shown for each TSV. An undiscerning slurry is employed to planarize substrate 102. As the dielectric layers are being polished, oxidizing agent 500 in the undiscerning slurry oxidizes conductor 126, allowing the CMP process to polish the conducting material as the bulk material and liner oxide are polished. The oxidizing agent is then removed from the surface of the conducting material during the last portion of the CMP process. The polished surface is denoted as C. During the CMP process, an in-situ IR gauge may be applied as an end-point detector to ensure desired Si thickness is obtained. After CMP, one more buffing step may be done by cleaning chemicals that contain a chelate agent (BTA, EDTA or surfactant) to remove Cu residual (Cu and Cu ion) on the surface of bulk material 110 and polish pad to avoid Cu contaminants.

Figures 6, 7:
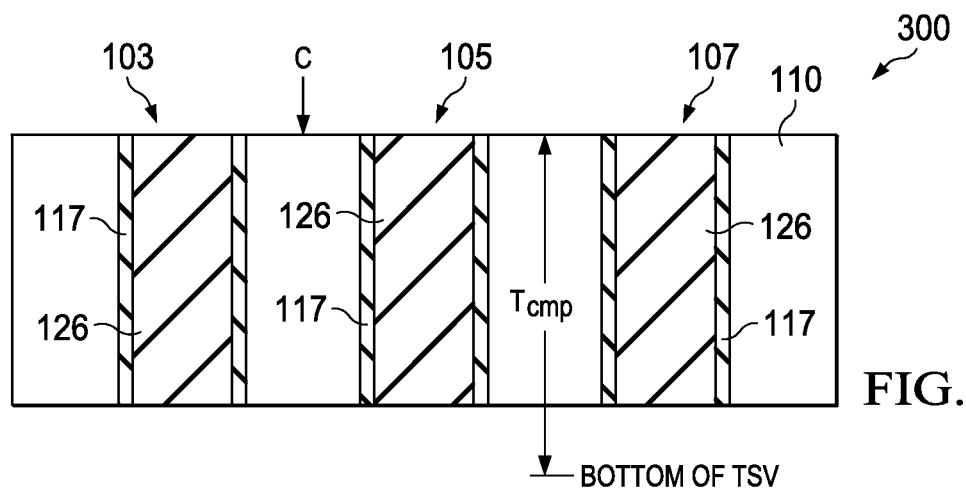
FIG. 6 is a chart of an example of slurry composition for an illustrative embodiment.
FIG. 7 is a cross-sectional view of a TSV substrate following CMP.

FIG. 6 shows examples of undiscerning slurry compositions for an embodiment that employs Cu as the conductive material and silicon as the bulk material. An abrasive, base, oxidizer, and an additive to protect the Cu may be implemented. The abrasive may be, for example, colloidal silica, or the like. The base may be KOH, $NH_4(OH)$, a combination of KOH and $NH_4(OH)$, or the like. The oxidizer may be $H_2O_2$, $KIO_3$, ammonium persulfate (APS), $KNO_3$, a combination thereof, or the like. The additive may be a Cu inhibitor, benzotriazole (BTA), ethylenediaminetetraacetic acid (EDTA), or the like. The Cu inhibitor may comprise, sulfuric acid, hydroxyethylidine, diphosphonic acid, and tolytriazole, for example. The ratio of oxidizer in the slurry is important to planarization uniformity. If too much oxidizer is added there may be dishing (indentations into the substrate), if too little oxidizer is added the Cu may protrude. In either case an unacceptable non-uniformity may occur. For example, for a KOH base slurry, oxidizer $H_2O_2$ content ranging from 0.02% to 0.2% may polish the conducting material and the bulk material to desired CMP surface C.

Returning to the cross-sectional figures, FIG. 7 shows area 300 with the plurality of TSVs exposed, including $TSV_{min}$ 105. The TSVs at this process step are of the uniform thickness $T_{cmp}$, which is equal to or less than the thickness of $TSV_{min}$. Thus, $T_{cmp} \leq T_{min}$.

Figure 8:
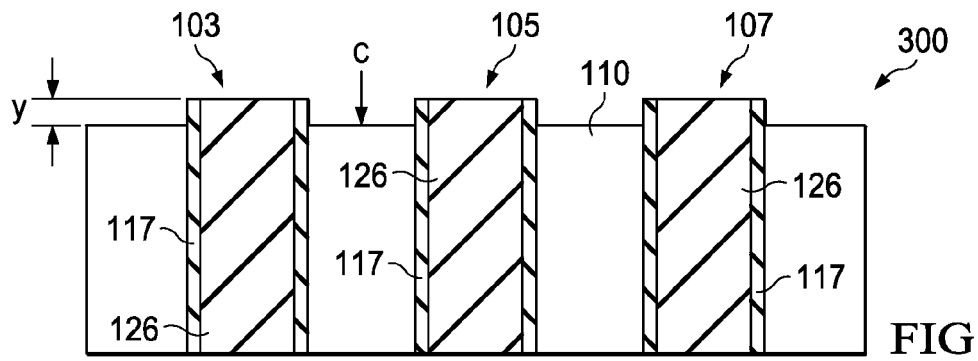
FIG. 8 is a cross-sectional view of a TSV substrate following spin wet-etch.

FIG. 8 shows area 300 following a spin wet-etch (step 108 in FIG. 1). Bulk material 110 is selectively etched to allow liner oxide 117 and conductor 126 to protrude from bulk material 110 by a thickness "y" from the CMP surface C. A spin wet-etch may be processed on a single substrate (wafer) tool that spins the substrate while dispensing a wet-etch formulation, for example. The spinning application may realize a better etch uniformity than a non-spinning tool. An example process recipe comprises an about 2.38% TMAH solution with a 2000 Å/min. etch rate. A protective formulation is added to the wet-etch recipe to protect conductor 126 during the spinning wet-etch. The recipe is preferably implemented at about 70° C., and is followed by a deionized water rinse. Major formulation of the etchant may be on the order of 2.38% TMAH and less than 1% additives, such as amine, will be added to protect the Cu surface from the TMAH etch. While various formulations will be recognized by those skilled in the art, illustrative formulations will typically contain between about 2.0% to about 2.8% TMAH. After the etching process, a DI rinse to remove TMAH and additive (DI soluble) from area 300 may be employed. Typically, 2000 A to 6000 A of bulk material is removed at this process. In illustrative embodiments, the wet-etch process provides etch selectivity between copper and silicon of between about 1:10 and 1:1000.

Figure 9:
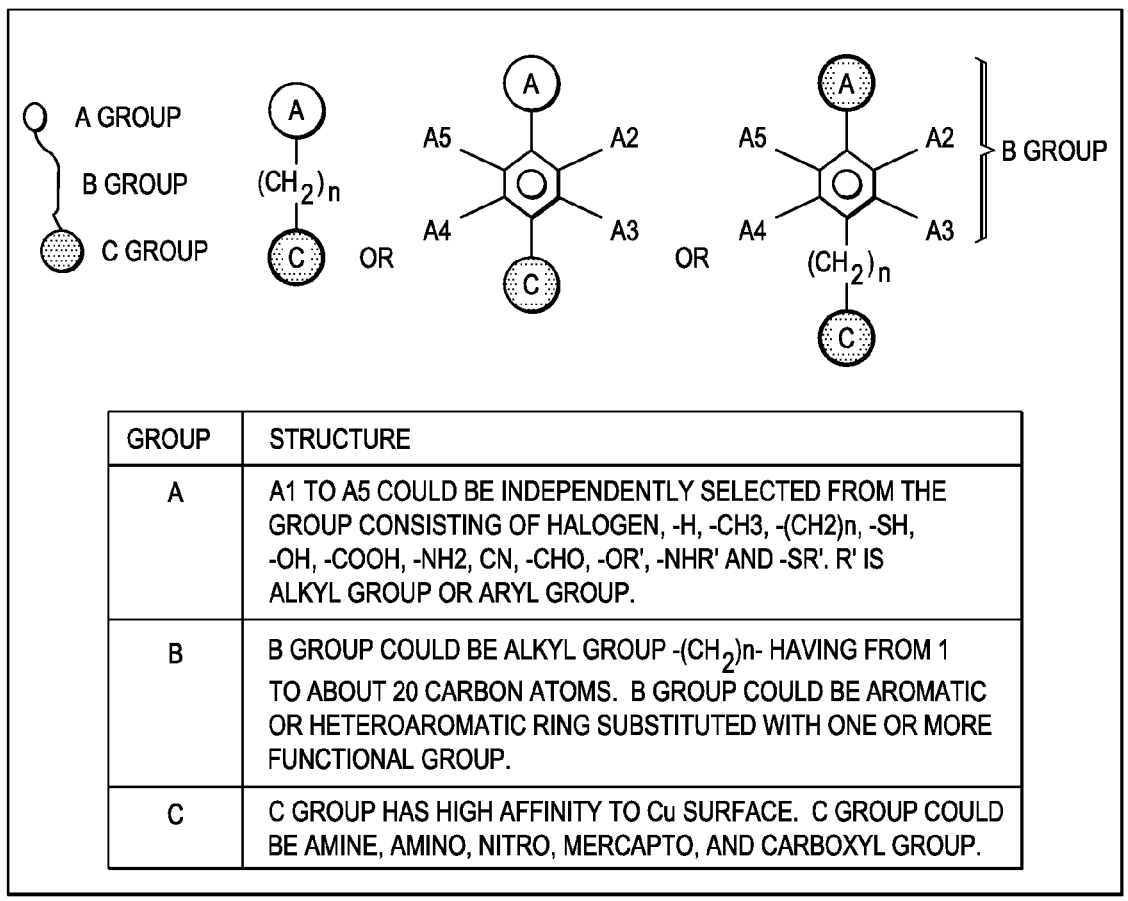
FIG. 9 is an example of spin wet-etch additives.

FIG. 9 shows a table of examples of protective formulations that may be added to protect the conductive material. In this example, TSVs are comprised of Cu, with a silicon nitride liner, in a bulk material of silicon. The protective formulations are implemented to protect the copper during the spinning wet-etch. Other protective formulations may be implemented to protect other conductive materials in other bulk materials. The example protective formulas comprise three parts, termed A group, B group, and C group. A group, a first portion of the protective formulation, may be selected from the group comprising halogen, —H, —CH3, —(CH2)n, —SH, —OH, —COOH, —NH2, CN, —CHO, —OR', —NHR' and —SR', R', wherein R' is in the alkyl group or aryl group. B Group may be an alkyl group —$(CH_2)n$, where n is from 1 to about 20 carbon atoms. B Group may be an aromatic or a heteroaromatic ring substituted with one or more functional groups. C Group has a high affinity to a Cu surface. C Group may be from an amine, amino, nitro, mercapto, or carboxyl group. An example for a formulation for one embodiment may be a 2.38% TMAH with a <1% amine base chemical additive. Another example formulation may be a 2.38% TMAH with a <1% hydroxyl group chemical.

Figure 10:
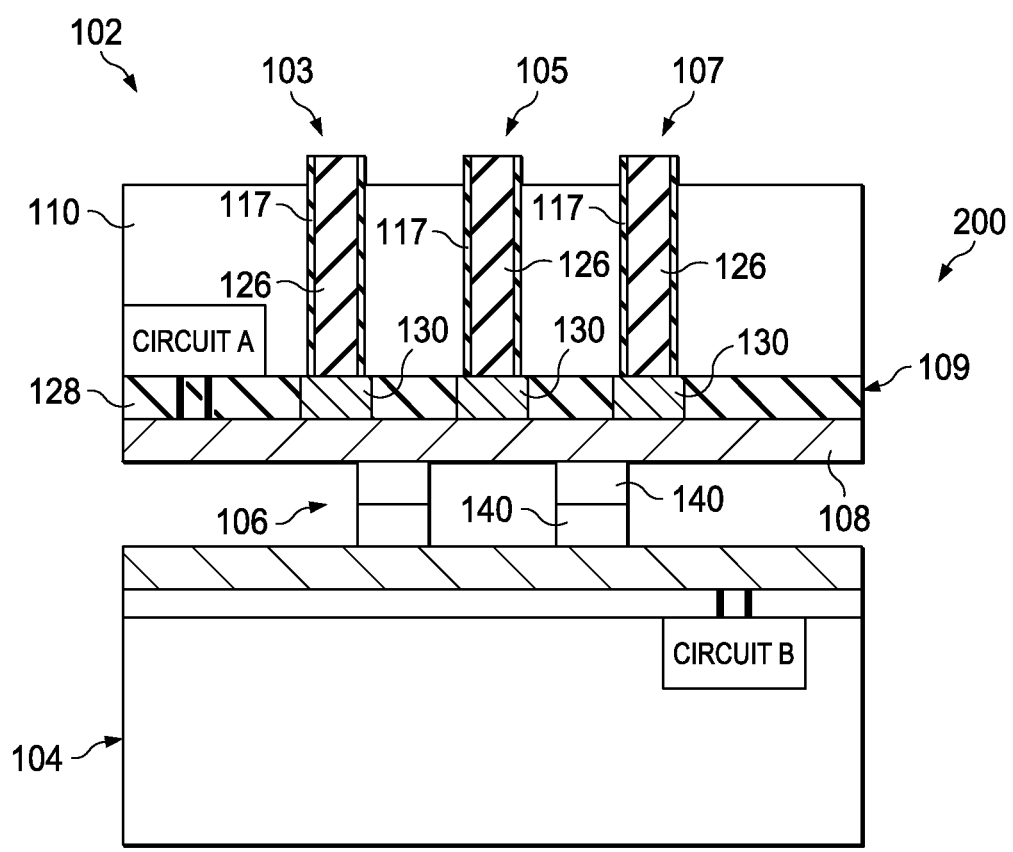
FIG. 10 is a cross-sectional view of a resultant substrate stacking system according to an illustrative embodiment.

FIG. 10 shows the resultant cross-sectional view of an illustrative embodiment. Substrate 102 (first substrate) is bonded to substrate 104 (second substrate) at joint 106. TVS 103, 105, and 107 are of substantially uniform thickness with the top of conductor 126 exposed. A small portion of liner oxide 117, including a portion of liner oxide 117 sidewalls are also exposed. Bulk material 110 is recessed from TSVs 103, 105 and 107. Further TSVs 103, 105, 107, and circuit A may be interconnected through layers 108 and 109 to bonding contacts 140 and contact pads 130, respectively. Thus, substrate 102 (first substrate) may be electrically contacted from the face side and the backside.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps

What is claimed is:

1. A method of forming a semiconductor device comprising:
   providing conductive material forming through vias having thicknesses in a range from a maximum thickness to a minimum thickness, embedded within a first substrate, wherein the first substrate comprises a non-conducting material;
   mechanically grinding a backside of the first substrate to a thickness wherein at least 1 µm of the non-conducting material remains covering the conductive material embedded within the first substrate so that the grinding exposes no portion of any one of the through vias, the thickness of the first substrate being greater than the maximum thickness following the grinding;
   following the grinding, employing chemical mechanical polishing (CMP) with an undiscerning slurry to the backside of the first substrate, thereby exposing the conductive material of each of the through vias, the thickness of the first substrate being less than the minimum thickness following the CMP; and
   following the CMP, employing a spin wet-etch, with a protective formulation to remove a thickness y of the non-conducting material from the backside of the first substrate, thereby causing the conductive material of each of the through vias to protrude from the backside of the first substrate.

2. The method of claim 1, wherein the undiscerning slurry comprises an oxidizer and an additive.

3. The method of claim 2, wherein the oxidizer is selected from a group consisting of $H_2O_2$, $KIO_3$, ammonium persulfate (APS), $KNO_3$, and a combination of $H_2O_2$, $KIO_3$, ammonium persulfate (APS), or $KNO_3$.

4. The method of claim 3, wherein the additive comprises a Cu inhibitor, benzotriazole (BTA), ethylenediaminetetraacetic acid (EDTA), or combinations of BTA and EDTA.

5. The method of claim 4, wherein the Cu inhibitor comprises sulfuric acid, hydroxyethylidine, diphosphonic acid, and tolytriazole.

6. The method of claim 1, wherein the protective formulation comprises a B group, and a C group, wherein the B group consists of —$(CH_2)n$, wherein n is from 1 to 20, and wherein the C group has an affinity to Cu.

7. The method of claim 6, wherein the protective formulation is an aromatic ring or a heteroaromatic ring.

8. The method of claim 6, wherein the protective formulation further comprises an A group and wherein the A group is halogen, —H, —$CH_3$, —$(CH_2)n$, —SH, —OH, —COOH, —NH2, CN, —CHO, —OR, —NHR or —SR, wherein R is in an alkyl group.

9. The method of claim 6, wherein the protective formulation further comprises an A group and wherein the A group is halogen, H, $CH_3$, $(CH_2)n$, SH, OH, COOH, NH2, CN, CHO, OR, NHR or SR, wherein R is in an aryl group.

10. The method of claim 6 wherein the C group is from an amino group, a nitro group, a mercapto group, or a carboxyl acid group.

11. The method of claim 1 wherein the employing a spin wet-etch further comprises:
   etching substrate material from the planarized backside of the first substrate using wet-etch chemicals in a spinning tool that spins the substrate, wherein the wet etch chemicals are selective to non-conducting material and non-selective to conductive material.

12. The method of claim 1, wherein the conductive material forms through substrate vias (TSVs).

13. The method of claim 1 further comprising:
   bonding a second substrate to a face side of the first substrate.

14. The method of claim 1, wherein the spin wet-etch employs tetramethyl ammonium hydroxide (TMAH).

15. The method of claim 14, wherein about 2.38%+/−0.02% TMAH is employed in the spin wet-etch.

16. A method of manufacturing a semiconductor structure, comprising:
   providing a substrate with a bulk material containing a plurality of through substrate vias (TSVs), ranging in thickness from Tmax to Tmin;
   mechanically grinding a backside of the substrate, wherein a remaining thickness X of the bulk material continues to protect the TSVs, no portion of any one of the TSVs being exposed by the mechanical grinding;
   following the mechanical grinding, chemical mechanical polishing the backside of the substrate thereby reducing the respective thicknesses of the plurality of TSVs to $T_{cmp}$, wherein $T_{cmp} \leq T_{min}$; wherein a portion of each of the plurality of TSVs is exposed following the chemical mechanical polishing; and
   following the chemical mechanical polishing, etching a thickness y of the bulk material from the backside of the substrate in a spin wet-etch employing a protective formulation.

17. The method of claim 16, wherein the spin wet-etch employs between about 2.0% and 2.8% of tetramethyl ammonium hydroxide (TMAH).

18. The method of claim 16, wherein a mechanical grinder employed in the mechanically grinding step is controlled by an in situ gauge.

19. The method of claim 18, wherein the in situ gauge is an infra-red laser gauge.

20. A method of manufacturing a semiconductor structure comprising:
- providing a silicon wafer with a copper through substrate via (TSV) beneath a surface of the silicon wafer;
- backgrinding the silicon wafer, wherein a remaining thickness of silicon continues to protect the TSV;
- subsequent to the backgrinding, using a slurry with an oxidizer, planarizing a backside of the silicon wafer to expose a portion of the TSV; and
- subsequent to the planarizing, wet-etching the silicon wafer in a spinning tool employing an etchant having an etch selectivity ratio between copper and silicon of between about 1:10 and about 1:1000, so that the TSV protrudes above the surface of the silicon wafer.

* * * * *